(12) United States Patent
Zan et al.

(10) Patent No.: US 9,236,492 B2
(45) Date of Patent: Jan. 12, 2016

(54) ACTIVE DEVICE

(71) Applicant: E Ink Holdings Inc., Hsinchu (TW)

(72) Inventors: Hsiao-Wen Zan, Hsinchu (TW);
Chuang-Chuang Tsai, Hsinchu (TW);
Pei-Chen Yu, Hsinchu (TW);
Hung-Chuan Liu, Hsinchu (TW);
Bing-Shu Wu, Hsinchu (TW); Yi-Chun Lai, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/161,705

(22) Filed: Jan. 23, 2014

(65) Prior Publication Data
US 2014/0326989 A1 Nov. 6, 2014

(30) Foreign Application Priority Data
May 6, 2013 (TW) .............................. 102116110 A

(51) Int. Cl.
*H01L 29/10* (2006.01)
*H01L 27/12* (2006.01)
*H01L 29/786* (2006.01)

(52) U.S. Cl.
CPC ...... *H01L 29/7869* (2013.01); *H01L 29/78696* (2013.01)

(58) Field of Classification Search
CPC .................. H01L 27/1225; H01L 27/1255
USPC ............ 257/43, E29.275; 977/809, 735, 938
See application file for complete search history.

(56) References Cited

U.S. PATENT DOCUMENTS

| 7,365,395 | B2 | 4/2008 | Stumbo et al. | |
| 7,381,586 | B2 | 6/2008 | Cheng et al. | |
| 7,465,612 | B2 | 12/2008 | Chae et al. | |
| 7,746,418 | B2 | 6/2010 | Wakita | |
| 8,089,152 | B2 | 1/2012 | Miller | |
| 8,183,566 | B2 | 5/2012 | Kobayashi et al. | |
| 2007/0052024 | A1* | 3/2007 | Lee et al. | 257/347 |
| 2007/0108480 | A1 | 5/2007 | Nanai et al. | |
| 2007/0235714 | A1* | 10/2007 | Kwon et al. | 257/9 |
| 2009/0224243 | A1 | 9/2009 | Kobayashi et al. | |
| 2013/0026443 | A1* | 1/2013 | Park et al. | 257/9 |

FOREIGN PATENT DOCUMENTS

TW 201227968 7/2012

OTHER PUBLICATIONS

"Office Action of Taiwan Counterpart Application", issued on Mar. 23, 2015, p. 1-p. 5.

* cited by examiner

*Primary Examiner* — Julio J Maldonado
*Assistant Examiner* — Moazzam Hossain
(74) *Attorney, Agent, or Firm* — Jianq Chyun IP Office

(57) ABSTRACT

An active device provided by the invention is disposed on a substrate and includes a gate, a gate insulating layer, an oxide semiconductor channel layer, a plurality of nano conductive wires, a source and a drain. The gate insulating layer is disposed between the gate and the oxide semiconductor channel layer. The nano conductive wires are distributed in the oxide semiconductor channel layer, in which the nano conductive wires do not contact the gate insulating layer and the nano conductive wires are arranged along a direction and not intersected with each other. The source and the drain are disposed on two sides opposite to each other of the oxide semiconductor channel layer, in which a portion of the oxide semiconductor channel layer is exposed between the source and the drain.

9 Claims, 2 Drawing Sheets

ACTIVE DEVICE

CROSS-REFERENCE TO RELATED APPLICATION

This application claims the priority benefit of Taiwan application serial no. 102116110, filed on May 6, 2013. The entirety of the above-mentioned patent application is hereby incorporated by reference herein and made a part of this specification.

BACKGROUND OF THE INVENTION

1. Field of the Invention

The invention generally relates to a semiconductor device, and more particularly, to an active device.

2. Description of Related Art

The most popular liquid crystal display (LCD) today is composed of a thin film transistor (TFT) array substrate, a color filter substrate and a liquid crystal layer between the above-mentioned two substrates. On a conventional TFT array substrate, it is mostly adopted that the amorphous silicon (a-Si) TFT or the low-temperature polysilicon TFT servers as a switching element of each sub-pixel. In recent years, some studies have pointed out that in comparison with an a-Si TFT, an oxide semiconductor TFT has higher field-effect mobility; and in comparison with a low-temperature polysilicon TFT, an oxide semiconductor TFT has better threshold-voltage uniformity (Vth uniformity). As a result, the oxide semiconductor TFT has the potential to become a key element for the next generation's planar displays. However, under its existing architecture, the conventional oxide semiconductor TFT is not easy to further enhance field-effect mobility.

SUMMARY OF THE INVENTION

Accordingly, the invention is directed to an active device with better field-effect mobility.

An active device provided by the invention is disposed on a substrate and includes a gate, a gate insulating layer, an oxide semiconductor channel layer, a plurality of nano conductive wires, a source and a drain. The gate insulating layer is disposed between the gate and the oxide semiconductor channel layer. The nano conductive wires are distributed in the oxide semiconductor channel layer, in which the nano conductive wires do not contact the gate insulating layer and the nano conductive wires are arranged along a direction and not intersected with each other. The source and the drain are disposed on two sides opposite to each other of the oxide semiconductor channel layer, in which a portion of the oxide semiconductor channel layer is exposed between the source and the drain.

In an embodiment of the invention, the oxide semiconductor channel layer is located between the gate and the substrate, and the source and the drain are located between the gate insulating layer and the substrate.

In an embodiment of the invention, the material of the oxide semiconductor channel layer includes indium-gallium-zinc oxide (IGZO), ZnO, indium-zinc oxide (IZO) or indium-zinc-tin oxide (ZITO).

In an embodiment of the invention, the material of the nano conductive wires includes silver, gold, platinum, palladium, molybdenum, aluminium, or a combination of the above mentioned.

In an embodiment of the invention, the diameter of each of the nano conductive wires is greater than or equal to 10 nm but less than or equal to 200 nm.

In an embodiment of the invention, the length of each of the nano conductive wires ranges from 100 nm to 1000 nm.

In an embodiment of the invention, the density of the nano conductive wires is at least $6 \times 10^6$ ($1/cm^2$).

In an embodiment of the invention, the above-mentioned direction is parallel to the direction from the source to the drain.

In an embodiment of the invention, the nano conductive wires are arranged on a same horizontal line.

In an embodiment of the invention, the nano conductive wires include an array of nano wires.

Based on the depiction above, since the nano conductive wires are distributed in the oxide semiconductor channel layer along a direction in the invention, the nano conductive wires are able to increase the conduction current of a device and reduce the current-leaking phenomenon. Thus, the active device of the invention can have higher field-effect mobility.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF THE EMBODIMENTS

Figure 1A:
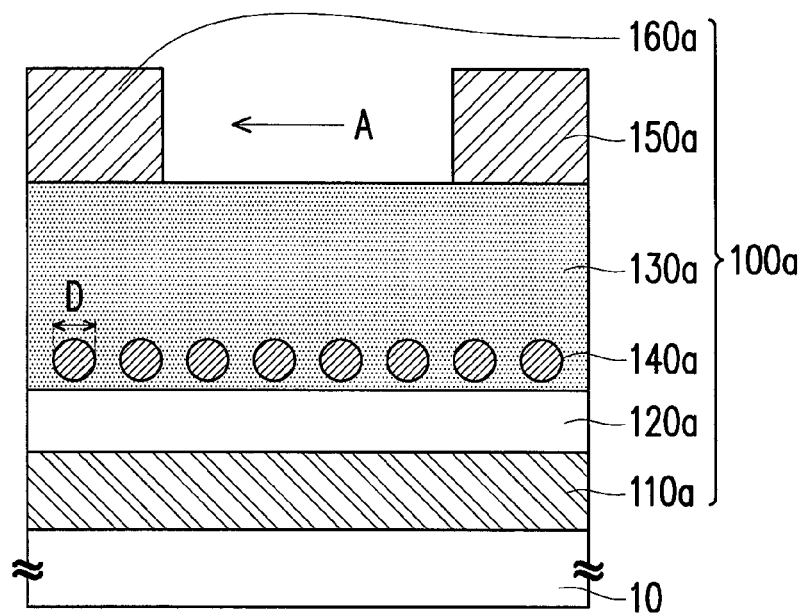
FIG. 1A is a cross-sectional diagram of an active device according to an embodiment of the invention.
Figure 1B:
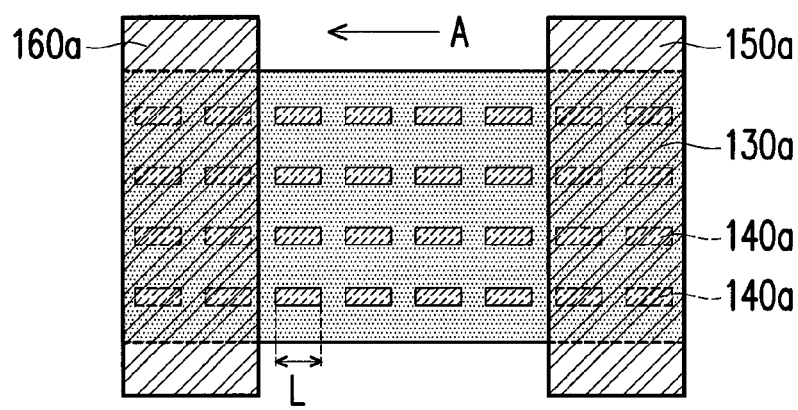
FIG. 1B is a top-view diagram illustrating the oxide semiconductor channel layer, the nano conductive wires, the source and the drain in FIG. 1A.

FIG. 1A is a cross-sectional diagram of an active device according to an embodiment of the invention and FIG. 1B is a top-view diagram illustrating the oxide semiconductor channel layer, the nano conductive wires, the source and the drain in FIG. 1A. Referring to FIGS. 1A and 1B, in the embodiment, an active device 100a is disposed on a substrate 10, in which the material of the substrate 10 is, for example, glass, plastic or other appropriate materials. The active device 100a includes a gate 110a, a gate insulating layer 120a, an oxide semiconductor channel layer 130a, a plurality of nano conductive wires 140a, a source 150a and a drain 160a.

In more details, in the embodiment, the gate 110a is disposed on the substrate 10, and the gate insulating layer 120a is disposed between the gate 110a and the oxide semiconductor channel layer 130a, in which the gate insulating layer 120a covers the gate 110a. The nano conductive wires 140a are distributed in the oxide semiconductor channel layer 130a. In particular, the nano conductive wires 140a do not contact the gate insulating layer 120a and are arranged along a direction A and not intersected with each other. The source 150a and the drain 160a are disposed on two sides opposite to each other of the oxide semiconductor channel layer 130a. A portion of the oxide semiconductor channel layer 130a is exposed between the source 150a and the drain 160a. The active device 100a composed of the gate 110a, the gate insulating layer 120a, the oxide semiconductor channel layer 130a, the nano conductive wires 140a, the source 150a and the drain 160a in the embodiment is substantially a bottom gate TFT, as shown in FIG. 1A.

The material of the oxide semiconductor channel layer 130a in the embodiment is, for example, indium-gallium-zinc oxide (IGZO), ZnO, indium-zinc oxide (IZO) or indium-zinc-tin oxide (ZITO), which the invention is not limited to. The method to form the oxide semiconductor channel layer 130a herein is, for example, PVD process, CVD process or sol-gel process, which the invention is not limited to. The material of the nano conductive wires 140a is, for example, silver, gold, platinum, palladium, molybdenum, aluminium, or a combination of the above mentioned. In particular, the diameter D of each of the nano conductive wires 140a is, for example, greater than or equal to 10 nm but less than or equal to 200 nm. In addition, the length L of each of the nano conductive wires 140a ranges from 100 nm to 1000 nm, and the density of the nano conductive wires 140a is at least $6 \times 10^6$ $(1/cm^2)$. As shown by FIGS. 1A and 1B, the direction A is substantially parallel to the direction from the source 150a to the drain 160a, and the nano conductive wires 140a are substantially arranged on a same horizontal line. The nano conductive wires 140a have directionality by means of, for example, spin coating process or blade coating process. The nano conductive wires 140a are, for example, an array of nano wires, which the invention is not limited to. The material of the gate insulating layer 120a is, for example, an organic insulating material or an inorganic insulating material, in which the organic insulating material is, for example, PI or resin and the inorganic insulating material is, for example, silicon oxide ($SiO_x$) or silicon nitride ($SiN_x$), which the invention is not limited to.

Since the nano conductive wires 140a are distributed in the oxide semiconductor channel layer 130a in the embodiment, the nano conductive wires 140a have directionality and the conductivity thereof is greater than the conductivity of the oxide semiconductor channel layer 130a, so that by using the nano conductive wires 140a in the oxide semiconductor channel layer 130a, the conduction current of the device can be effectively increased and the current-leaking phenomenon can be reduced. In comparison with the conventional metal oxide semiconductor TFT (MOSTFT), the field-effect mobility of the active device 100a in the embodiment can be increased for 10 times. In other words, the active device 100a of the embodiment can have higher field-effect mobility to further have better electrical performance.

Figure 2:
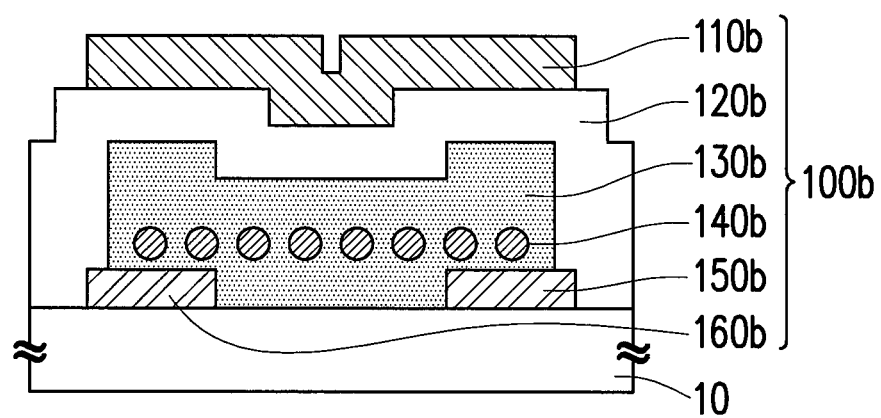
FIG. 2 is a cross-sectional diagram of an active device according to another embodiment of the invention.

FIG. 2 is a cross-sectional diagram of an active device according to another embodiment of the invention. It should be noted the component notations and partial details of the structures hereinafter provided in the embodiments are the same as or similar to the previous embodiment, wherein the same notations represent the same or similar components while the repeated same details are omitted, which can refer to the previous embodiment, which is omitted to describe in the embodiment.

Referring to FIG. 2, the major difference of the active device 100b from the active device 100a of the previous embodiment rests in that the stacking way for the gate 110b, the gate insulating layer 120b, the oxide semiconductor channel layer 130b, the nano conductive wires 140b, the source 150b and the drain 160b in the active device 100b is different from the stacking way in the previous embodiment.

In more details, the source 150b and the drain 160b are disposed on the substrate 10, the oxide semiconductor channel layer 130b is located between the gate 110b and the substrate 10, and the source 150b and the drain 160b are located between the gate insulating layer 120b and the substrate 10. As shown by FIG. 2, the active device 100b composed of the gate 110b, the gate insulating layer 120b, the oxide semiconductor channel layer 130b, the nano conductive wires 140b, the source 150b and the drain 160b in the embodiment is substantially a top gate TFT.

In summary, since the nano conductive wires are distributed in the oxide semiconductor channel layer in the invention, and the nano conductive wires have directionality and the conductivity of the nano conductive wires is greater than the conductivity of the oxide semiconductor channel layer, the nano conductive wires in the oxide semiconductor channel layer can be used to effectively increase the conduction current of the device and reduce the current-leaking phenomenon. Thus, the active device of the invention can have higher field-effect mobility to further have better electrical performance.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. An active device, disposed on a substrate and comprising:
    a gate;
    an oxide semiconductor channel layer;
    a gate insulating layer, disposed between the gate and the oxide semiconductor channel layer;
    a plurality of nano conductive wires, distributed in the oxide semiconductor channel layer, wherein the nano conductive wires do not contact the gate insulating layer and the nano conductive wires are arranged along a direction and not intersected with each other; and
    a source and a drain, disposed on two sides opposite to each other of the oxide semiconductor channel layer, wherein a portion of the oxide semiconductor channel layer is exposed between the source and the drain, wherein the direction is parallel to the direction from the source to the drain.

2. The active device as claimed in claim 1, wherein the oxide semiconductor channel layer is located between the gate and the substrate, and the source and the drain are located between the gate insulating layer and the substrate.

3. The active device as claimed in claim 1, wherein material of the oxide semiconductor channel layer comprises indium-gallium-zinc oxide (IGZO), ZnO, indium-zinc oxide (IZO) or indium-zinc-tin oxide (ZITO).

4. The active device as claimed in claim 1, wherein material of the nano conductive wires comprises silver, gold, platinum, palladium, molybdenum, aluminium, or a combination of the above mentioned.

5. The active device as claimed in claim 1, wherein a diameter of each of the nano conductive wires is greater than or equal to 10 nm but less than or equal to 200 nm.

6. The active device as claimed in claim 1, wherein a length of each of the nano conductive wires ranges from 100 nm to 1000 nm.

7. The active device as claimed in claim 1, wherein a density of the nano conductive wires is at least $6 \times 10^6$ $(1/cm^2)$.

8. The active device as claimed in claim 1, wherein the nano conductive wires are arranged on a same horizontal line.

9. The active device as claimed in claim 1, wherein the nano conductive wires comprise an array of nano wires.

* * * * *